(12) United States Patent
Zhang et al.

(10) Patent No.: US 8,762,807 B2
(45) Date of Patent: *Jun. 24, 2014

(54) SYSTEMS AND METHODS FOR OUT OF ORDER PROCESSING IN A DATA RETRY

(71) Applicant: LSI Corporation, San Jose, CA (US)

(72) Inventors: Fan Zhang, Milpitas, CA (US); Yang Han, Sunnyvale, CA (US); Shaohua Yang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/869,862

(22) Filed: Apr. 24, 2013

(65) Prior Publication Data

US 2013/0246888 A1    Sep. 19, 2013

Related U.S. Application Data

(63) Continuation of application No. 13/326,363, filed on Dec. 15, 2011, now Pat. No. 8,443,251.

(51) Int. Cl.
*H03M 13/00* (2006.01)
*H03M 13/03* (2006.01)

(52) U.S. Cl.
USPC .......................................... 714/752; 714/786

(58) Field of Classification Search
USPC ......... 714/752, 799, 791, 786, 759, 746, 795; 375/259, 261, 262, 265, 341; 341/94, 341/89
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 5,797,020 A * | 8/1998 | Bonella et al. | 710/240 |
| 6,405,342 B1 * | 6/2002 | Lee | 714/792 |
| 6,438,717 B1 | 8/2002 | Butler | |
| 6,657,803 B1 | 12/2003 | Ling et al. | |
| 7,076,719 B2 * | 7/2006 | Anjo et al. | 714/749 |
| 7,136,244 B1 | 11/2006 | Rothberg | |
| 7,702,989 B2 | 4/2010 | Graef et al. | |
| 7,730,384 B2 | 6/2010 | Graef et al. | |
| 7,738,201 B2 | 6/2010 | Jin et al. | |
| 7,971,125 B2 | 6/2011 | Graef et al. | |
| 7,990,642 B2 | 8/2011 | Lee et al. | |
| 8,176,404 B2 | 5/2012 | Yang et al. | |
| 8,443,251 B1 * | 5/2013 | Zhang et al. | 714/752 |
| 2011/0080211 A1 | 4/2011 | Yang | |

(Continued)

FOREIGN PATENT DOCUMENTS

| | | |
|---|---|---|
| EP | 2242054 A2 | 10/2010 |
| WO | WO 2008/087042 A1 | 7/2008 |
| WO | WO 2011/091845 a1 | 8/2011 |

OTHER PUBLICATIONS

Chase, D, "A Class of Algorithms for Decoding Block Codes with Channel Information" IEEE Transactions on Info theory, vol. 18, No. 1 Jan. 1, 1972.

(Continued)

*Primary Examiner* — Christine Tu
(74) *Attorney, Agent, or Firm* — Hamilton, DeSanctis & Cha (57) ABSTRACT

Various embodiments of the present invention provide systems and methods for data processing that includes selectively reporting results out of order or in order.

20 Claims, 7 Drawing Sheets

(56) References Cited

U.S. PATENT DOCUMENTS

| | | |
|---|---|---|
| 2011/0161633 A1 | 6/2011 | Xu |
| 2012/0200954 A1 | 8/2012 | Jin |
| 2012/0236429 A1 | 9/2012 | Yang |

OTHER PUBLICATIONS

Dong-U Lee et al "Pilotless Frame Synchronization via LDPC Code Constraint Feedback" IEEE Comm. Letters, NJ, US vol. 11 No. 8, Aug. 1, 2007.

Olmos et al., "Tree-Structure Expectation Propagation for LDPC Decoding in Erasure Channels", Cornell University Library arXiv:1009.4287 (Sep. 22, 2010).

U.S. Appl. No. 13/474,672, Unpublished (filed May 17, 2012) (Fan Zhang).

U.S. Appl. No. 13/326,363, Unpublished (filed Dec. 15, 2011) (Fan Zhang).

U.S. Appl. No. 13/372,600, Unpublished (filed Feb. 14, 2012) (Shaohua Yang).

U.S. Appl. No. 13/326,367, Unpublished (filed Dec. 15, 2011) (Shaohua Yang).

U.S. Appl. No. 13/483,982, Unpublished (filed May 30, 2012) (Yang Han).

U.S. Appl. No. 13/412,492, Unpublished (filed Mar. 5, 2012) (Shaohua Yang).

U.S. Appl. No. 13/445,858, Unpublished (filed Apr. 12, 2012) (Johnson Yen).

U.S. Appl. No. 13/465,214, Unpublished (filed May 7, 2012) (Chung-Li Wang).

U.S. Appl. No. 13/459,282, Unpublished (filed Apr. 30, 2012) (Fan Zhang).

U.S. Appl. No. 13/560,737, Unpublished (filed Jul. 27, 2012) (Weijun Tan).

U.S. Appl. No. 13/602,440, Unpublished (filed Sep. 4, 2012) (Fan Zhang).

U.S. Appl. No. 13/644,542, Unpublished (filed Oct. 4, 2012) (Shaohua Yang).

U.S. Appl. No. 13/644,589, Unpublished (filed Oct. 4, 2012) (Shaohua Yang).

U.S. Appl. No. 13/490,849, Unpublished (filed Jun. 7, 2012) (Johnson Yen).

\* cited by examiner

SYSTEMS AND METHODS FOR OUT OF ORDER PROCESSING IN A DATA RETRY

CROSS REFERENCE TO RELATED APPLICATION

The present application claims priority to U.S. patent application Ser. No. 13/326,363 entitled "Systems and Methods for Out of Order Processing in a Data Retry" and filed on Dec. 15, 2011 by Zhang et al. The entirety of the aforementioned reference is incorporated herein by reference for all purposes.

BACKGROUND OF THE INVENTION

The present inventions are related to systems and methods for detecting and/or decoding information, and more particularly to systems and methods for out of order processing in a data processing system.

Various data transfer systems have been developed including storage systems. Such data transfer systems involve writing encoded information to a storage medium, and later at the direction of a host transferring data from the storage medium and decoding the transferred information. The data decoding is done with a data processing circuit that may include one or more data detector circuits and one or more data decoder circuits that process information with the processed information then being passed to the directing host. The data transferred to the directing host is often transferred in a relatively large block of data from which the directing host can access relevant portions. In some cases, the data processing circuit is unable to converge on the originally written data set, and must perform one or more retries in an attempt to obtain the originally written data. Such retries can substantially delay transfer of a data block from the data processing circuit to the host.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for out of order processing in a data processing system.

Various embodiments of the present invention provide data processing systems that include: a data requesting circuit, a data decoder circuit, and a data output circuit. The data requesting circuit is operable to request an ordered data set. The ordered data set includes: a first output corresponding to a first decoder input, and a second output corresponding to a second decoder input. The first output precedes the second output in the ordered data set. The data decoder circuit is operable to: apply a data decode algorithm to the first decoder input to yield a first decode output; and apply the data decode algorithm to the second decoder input to yield a second decode output. The second decode output is available before the first decode output. The data output circuit is operable to report the first output derived from the first decode output and the second output derived from the second decode output to the data requesting circuit. The order of reporting the first output and the second output to the requesting circuit is based at least in part on a retry condition being met. In some instances of the aforementioned embodiments, the data processing system is implemented as part of a data storage device. In various instances of the aforementioned embodiments, the data processing system is implemented as an integrated circuit. In various cases, the data decode algorithm is a low density parity check algorithm.

In various instances of the aforementioned embodiments, the data output circuit is operable to report the second output prior to the first output when the retry condition is met and the first decode output is not yet available. In some instances of the aforementioned embodiments, the data output circuit is operable to report the first output prior to the second output when the retry condition is met and the first decode output is available. In various instances of the aforementioned embodiments, the data output circuit is operable to report the first output prior to the second output when the retry condition is not met. In particular cases, the retry condition is met when a timeout condition occurs. In various cases, when the retry condition is met, a retry processing algorithm is applied to a failed codeword.

Other embodiments of the present invention provide data processing systems that include: a data requesting circuit, a data detector circuit, a data decoder circuit, and a data output circuit. The data requesting circuit is operable to request an ordered data set that includes: a first output corresponding to a first detector input, and a second output corresponding to a second detector input. The first output precedes the second output in the ordered data set. The data detector circuit is operable to: apply a data detection algorithm to the first detector input to yield a first detected output; and apply the data detection algorithm to the second detector input to yield a second detected output. The data decoder circuit is operable to: apply a data decode algorithm to the first decoder input derived from the first detected output to yield a first decode output; and apply the data decode algorithm to the second decoder input derived from the second detected output to yield a second decode output. The second decode output is available before the first decode output. The data output circuit is operable to selectively report the first output derived from the first decode output and the second output derived from the second decode output out of order based at least in part on a retry condition being met. In some instances of the aforementioned embodiments, the data processing system is implemented as part of a data storage device. In various instances of the aforementioned embodiments, the data processing system is implemented as an integrated circuit. In various cases, the data decode algorithm is a low density parity check algorithm, and the data detection algorithm may be, but is not limited to, a maximum a posteriori data detection algorithm or a Viterbi data detection algorithm.

In some cases, the retry condition is met when a timeout condition occurs in relation to a failed codeword. In various cases, when the retry condition is met, a retry processing algorithm is applied to the failed codeword. In some instances of the aforementioned embodiments, the data output circuit is operable to: report the second output prior to the first output when the retry condition is met and the first decode output is not yet available; report the first output prior to the second output when the retry condition is met and the first decode output is available; and report the first output prior to the second output when the retry condition is not met.

Yet other embodiments of the present invention provide methods for data processing in a storage device. The methods include receiving a request for an ordered data set that has at least a first output corresponding to a first decoder input, and a second output corresponding to a second decoder input. The first output precedes the second output in the ordered data set. The methods further include: accessing a storage medium to obtain the ordered data set; applying a data decode algorithm to the first decoder input to yield a first decode output; and applying the data decode algorithm to the second decoder input to yield a second decode output. The second decode output is available before the first decode output. In addition, the methods include: determining a retry status of a data processing circuit applying the data decode algorithm; and selectively reporting the first output derived from the first decode output and the second output derived from the second decode output. The reporting is selected as out of order based at least in part on the retry status indicating a retry is selected, or as in order based at least in part on the retry status indicating a retry is not selected.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for out of order processing in a data processing system.

Various embodiments of the present invention provide systems and methods for reporting results from a data processing circuit out of order. In some cases, the embodiments provide for selective out of order reporting based upon the advent of a retry condition in the data processing circuit. As an example, a block of data may be requested by the host. The block of data is maintained in an encoded form on a storage medium from which it is accessed. A data processing circuit decodes the block of data and where the decoding ends without incident, the block of data is provided to the host in an ordered fashion. Alternatively, where one or more codewords are not readily decodable, a retry is performed. Such a retry results in considerable delay in one or more non-converging codewords. Rather than await completion of the retry in hopes that the non-converging codewords can be properly decoded, the previously converged codewords from the block of data are reported to the host without further delay. In some cases where the host was not relying on the non-converging elements of the block of data, providing the data out of order can substantially reduce the latency of a request for data.

Figure 1:
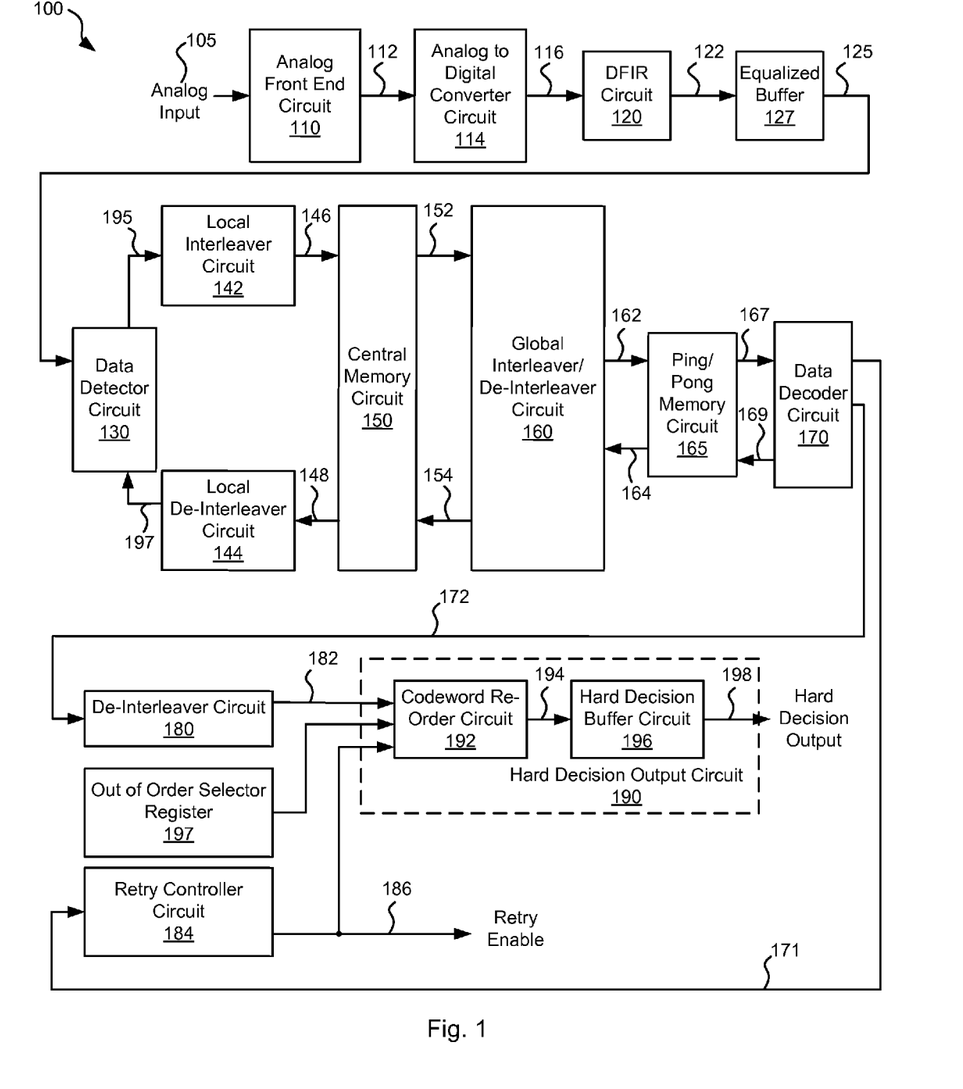
FIG. 1 depicts a data processing system including selectable out of order reporting in accordance with one or more embodiments of the present invention.

Turning to FIG. 1, a data processing system 100 including selectable out of order reporting is depicted in accordance with one or more embodiments of the present invention. Data processing system 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 122. In some embodiments of the present invention, equalizer circuit 120 is a digital finite impulse response filter circuit as are known in the art. Equalized data 122 is stored to an equalized buffer 127 that is operable to store the equalized data for at least one codeword (i.e., set of encoded data). As the equalized output is stored to equalized buffer 127, a sector tag is assigned to the equalized data set that indicates a codeword with which it is associated. Each sector tag is unique from others in equalized buffer 127. The sector tags are used to assemble an ordered block of codewords that is reported to a requesting host. In some cases, the reporting order is the same as the order in which the data sets are received from the storage medium. The stored data is accessible from equalized buffer 127 as a buffered output 125.

Buffered output 125 is provided to detector circuit 130 that is operable to apply a data detection algorithm to a received data set, and in some cases can process two or more data sets in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Based upon the disclosure provided herein, one of ordinary skill in the art will recognize a variety of data detector circuits that may be used in relation to different embodiments of the present invention. Data detector circuit 130 is started based upon availability of a data set from either equalizer 120 or efficient interleaving/de-interleaving circuit 140.

Data detector circuit 130 applies the data detection algorithm to either a data set received as buffered output 125 or to a data set received as de-interleaved output 197 from local de-interleaver circuit 140. The result of applying the data detection algorithm is a detected output 195 that is provided to a local interleaver circuit 142. When a detected output 195 is ready, it is stored to a central memory circuit 150 where it awaits processing by a data decoder circuit 170. In some cases, detected output 195 is log likelihood ratio data. Before being stored to central memory circuit 150, detected output 195 is processed through local interleaver circuit 142 that shuffles sub-portions (i.e., local chunks) of the data set included as detected output 195 and provides an interleaved data set 146 that is stored to central memory circuit 150. Such shuffling of sub-portions reduces the impact of any burst errors in the data set.

A ping/pong memory circuit 165 is used to pull a global interleaved data set 162 from central memory circuit 150 for data decoder circuit 170 by way of a global interleaver/de-interleaver circuit 160. Once data decoder circuit 170 is available, a global interleaved data set 167 is pulled from ping/pong memory circuit 165 and data decoder circuit 170 applies a data decode algorithm to the received data set. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. As the data decode algorithm completes on a given data set, the completed data set is written back as a decoded output 169 to ping/pong memory circuit 165. Once the write back is complete to ping/pong memory circuit 165, a corresponding data set 164 is transferred to central memory circuit 150 by way of global interleaver/de-interleaver circuit 160.

When a data set is transferred from central memory circuit 150 as a locally interleaved data set 152, global interleaver/de-interleaver circuit 160 rearranges global chunks of data sets such that multiple data sets may be intermixed across a single row of ping/pong memory 165. A global chunk may be the same size as the local chunks, while in other cases the global chunks may be different in size from the local chunks.

When data set 164 is written from ping/pong memory circuit 165 to central memory circuit 150, global interleaver/de-interleaver circuit 160 reverses the global interleaving (i.e., performs a de-interleaving process) originally applied when the data was originally written from central memory circuit 150 to ping/pong memory circuit 165. This reversal yields a locally interleaved data set 154 that is written to central memory circuit 150. When data detector circuit 130 becomes free, a corresponding locally interleaved data set 148 is provided to data detector circuit 130 as a de-interleaved data set 197 by a local de-interleaver circuit 144. Local de-interleaver circuit 144 reverses the processes originally applied by local interleaver circuit 142. Once data detector circuit 130 completes application of the detection algorithm to de-interleaved data set 197, the result is provided as detected output 195.

Where data decoder circuit 170 converges (i.e., results in the originally written data), the resulting decoded data is provided as a hard decision output 183 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 includes a codeword re-order circuit 192 that arranges the received codeword along with other previously received codewords in an order expected by a requesting host processor. In some cases, for example, thirty-two codewords may be requested by a host in one request. Codeword re-order circuit 192 assembles the requested thirty-two codewords in a desired order and provides the ordered codewords as a codeword block 194. Until all of the requested thirty-two codewords are available, codeword block 194 is not made available absent the occurrence of a retry request indicated by a retry enable signal 186. A hard decision buffer circuit 196 buffers the codeword block 194 as it is transferred to the requesting host as a hard decision output 198.

In contrast, where data decoder circuit 170 fails to converge (i.e., doers not yield the originally written data) and a condition arises that precludes further processing of the current codeword by the data processing circuit 100 (e.g., a timeout condition, or lack of storage available in central memory circuit 150 or equalized buffer 127), a failure status signal 171 is asserted by data decoder circuit 170. In response, a retry controller circuit 184 signals a retry condition for the particular codeword by asserting retry enable signal 186. Upon assertion of retry enable signal 186, data processing circuit applies a retry process to recover the non-converging codeword. The retry process may include, but is not limited to: (1) re-reading the particular codeword from a storage medium and reprocessing the re-read data, (2) changing one or more parameters governing operation of data processing circuit 100 before re-applying the data processing to the previously read data, or (3) a combination of the aforementioned. Based upon the disclosure provided herein, one of ordinary skill in the art will recognize a variety of retry algorithms that may be applied in an attempt to recover a non-converging codeword.

In addition, when retry enable signal 186 is asserted, codeword re-order circuit 192 transfers the existing converged codewords as codeword block 194 with an indication of which codewords are not valid. Further, subsequent to the initial transfer of codewords already ordered by codeword re-order circuit 192, codewords previously missing from the requested block are then provided to the requesting host via hard decision buffer circuit 196 by codeword re-order circuit 192 as they are received from data decoder circuit 170.

Figure 2:
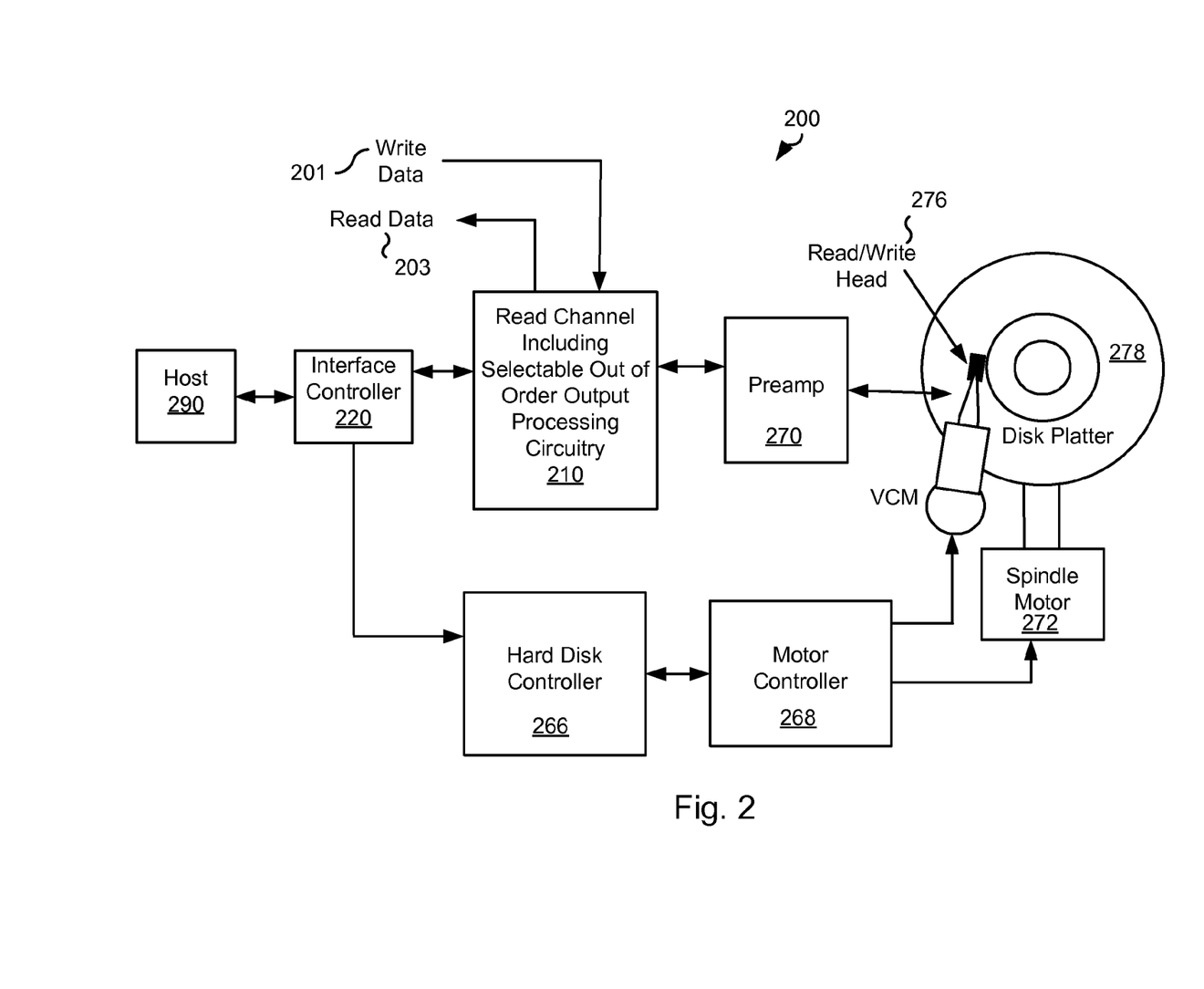
FIG. 2 shows a storage system with selectable out of order reporting circuitry in accordance with various embodiments of the present invention.

Turning to FIG. 2, a storage system 200 with selectable out of order reporting circuitry is shown in accordance with various embodiments of the present invention. Storage system 200 also includes a preamplifier 270, an interface controller 220, a hard disk controller 266, a motor controller 268, a spindle motor 272, a disk platter 278, and a read/write head 276. Interface controller 220 controls addressing and timing of data to/from disk platter 278. The data on disk platter 278 consists of groups of magnetic signals that may be detected by read/write head assembly 276 when the assembly is properly positioned over disk platter 278. In one embodiment, disk platter 278 includes magnetic signals recorded in accordance with either a longitudinal or a perpendicular recording scheme. Storage system 200 is controlled by a host 290.

In a typical read operation, read/write head assembly 276 is accurately positioned by motor controller 268 over a desired data track on disk platter 278. The desired track is identified in part using the zone based servo data processing circuit. Motor controller 268 both positions read/write head assembly 276 in relation to disk platter 278 and drives spindle motor 272 by moving read/write head assembly to the proper data track on disk platter 278 under the direction of hard disk controller 266. Spindle motor 272 spins disk platter 278 at a determined spin rate (RPMs). Once read/write head assembly 278 is positioned adjacent the proper data track, magnetic signals representing data on disk platter 278 are sensed by read/write head assembly 276 as disk platter 278 is rotated by spindle motor 272. The sensed magnetic signals are provided as a continuous, minute analog signal representative of the magnetic data on disk platter 278. This minute analog signal is transferred from read/write head assembly 276 to read channel module 210 via preamplifier 270. Preamplifier 270 is operable to amplify the minute analog signals accessed from disk platter 278. In turn, read channel circuit 210 decodes and digitizes the received analog signal to recreate the information originally written to disk platter 278. This data is provided as read data 203 to a receiving circuit.

As part of decoding the received information, read channel module 210 performs a data decode and/or data detection on the received data. Where the data processing fails to converge on the originally written data, selective out of order reporting of data processing results may be performed on the advent of a retry condition in the data processing circuit. Such selective out of order reporting may be implemented in a data processing circuit similar to that discussed above in relation to FIG. 1. Further, the out of order reporting may be performed similar to that discussed below in relation to FIGS. 3a-3c and FIG. 4. Host 290 may process received results from the data processing circuit similar to that discussed below in relation to FIGS. 5-6.

It should be noted that storage system 200 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 200, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 3A:
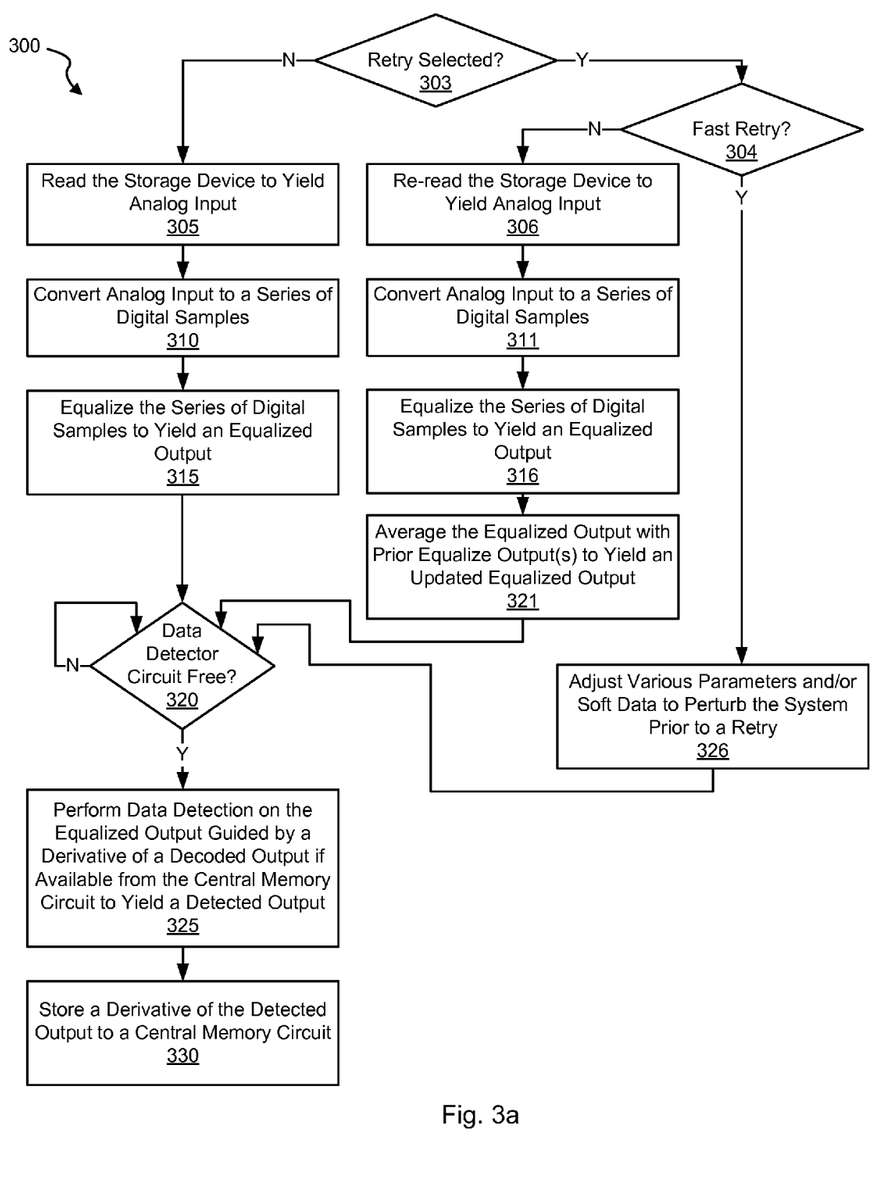
FIGS. 3a-3c are flow diagrams showing a method in accordance with some embodiments of the present invention for performing data processing including selectable out of order reporting.
Figure 3B:
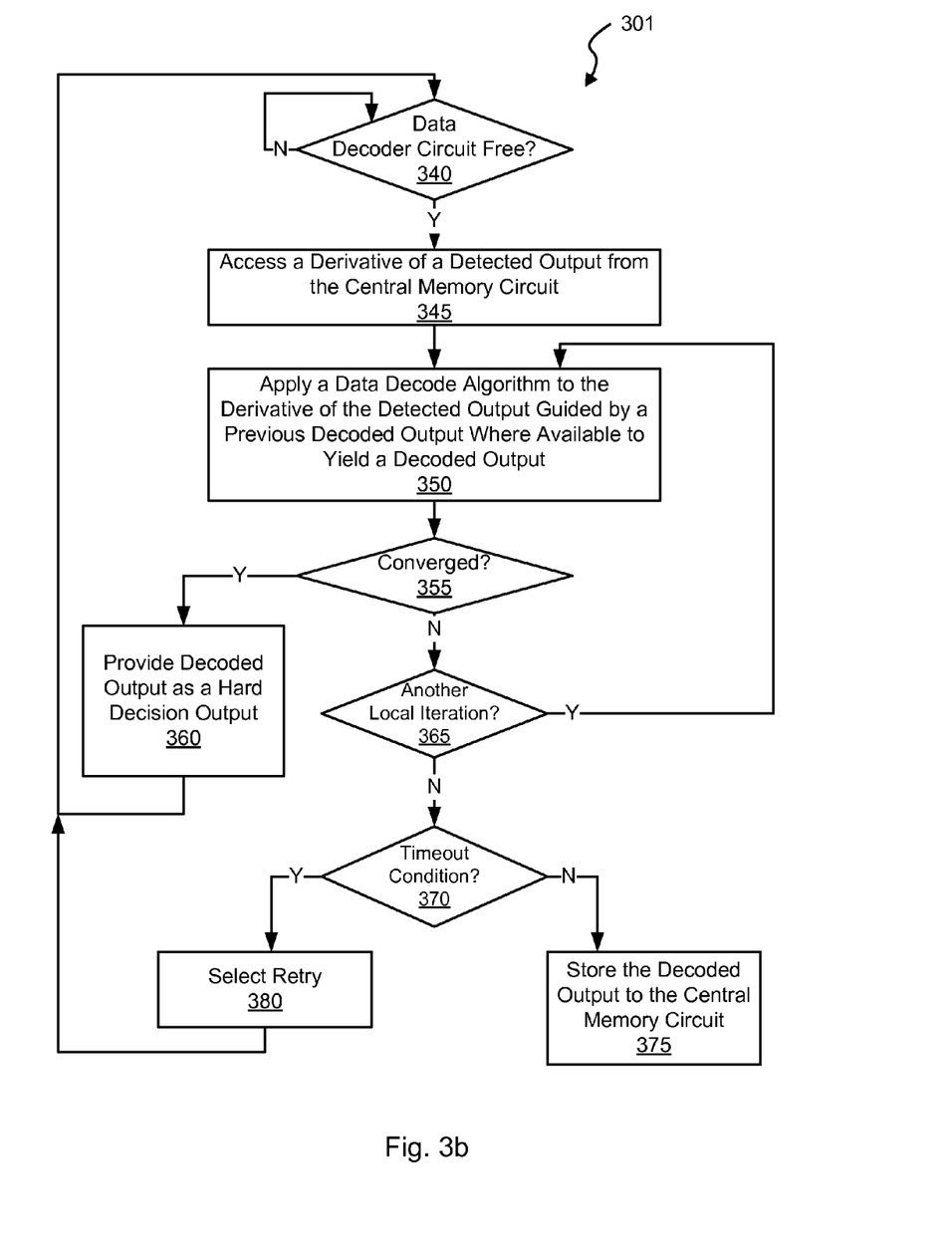
Figure 3C:
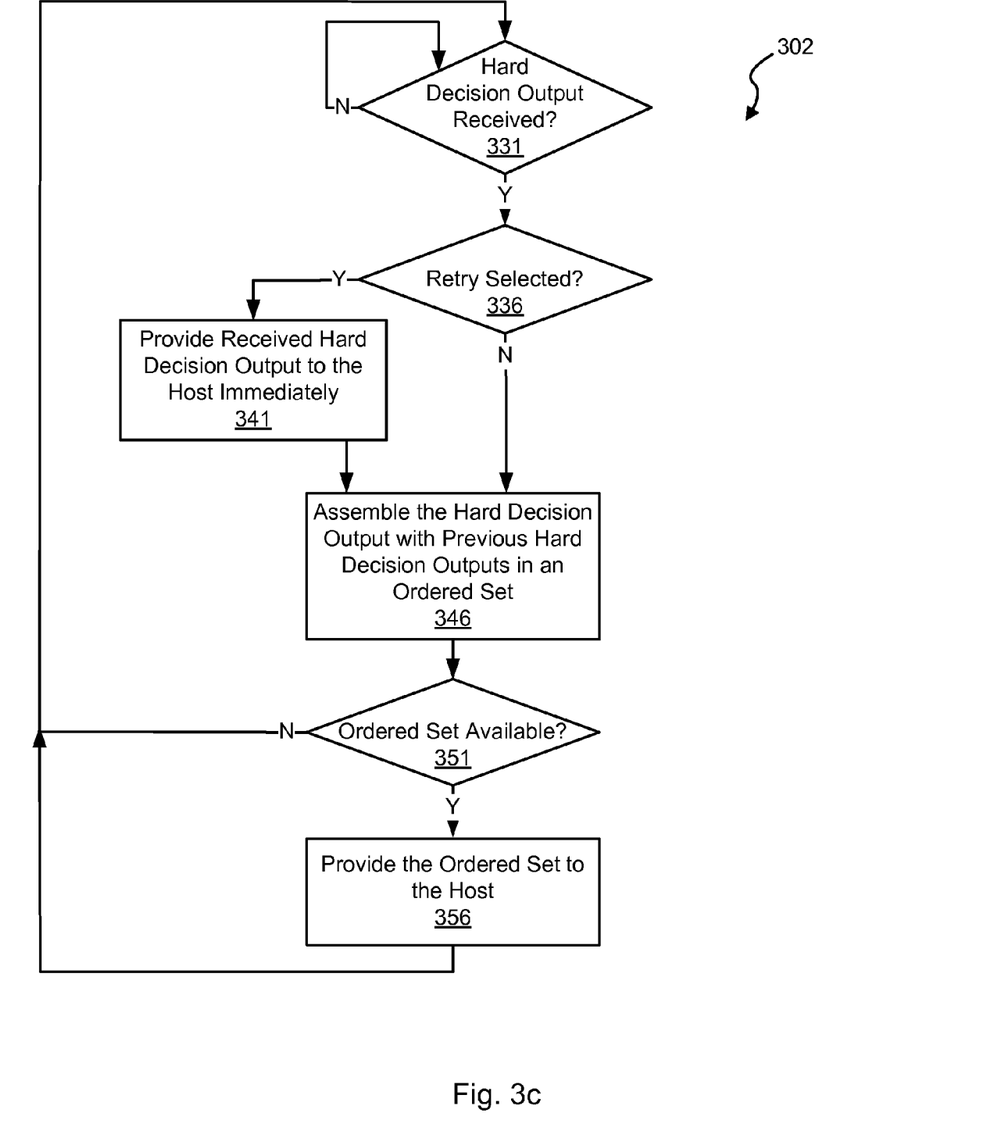

Turning to FIG. 3a-3c, flow diagrams 300 show a method in accordance with some embodiments of the present invention for performing data processing including selectable out of order reporting. Following flow diagram 300, it is determined whether a retry condition has been selected (block 303). A selection of a retry condition may be indicated, for example, by a retry enable signal. The retry enable signal may be asserted when a decoded output fails to converge and no additional processing cycles may be provided to aid the convergence. Where a retry condition is not selected (block 303), a storage device or medium is read to yield an analog signal corresponding thereto (block 305), and the analog input is converted to a series of digital samples (block 310). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 315). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 320). Where a data detector circuit is available (block 320), a data detection algorithm is applied to the equalized output guided by a data set derived from a decoded output where available (e.g., the second and later iterations through the data detector circuit and the data decoder circuit) from a central memory circuit to yield a detected output (block 325). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 330).

Alternatively, where a retry condition is selected (block 303), it is determined whether the retry to be implemented is a fast retry or a full retry (block 304). Where a full retry is to be implemented (block 304), the storage device is re-read to yield an analog input (block 306), and the analog input is converted to a series of digital samples (block 311). The resulting digital samples are equalized to yield an equalized output (block 316), and the equalized output is averaged with prior equalized outputs to yield an updated equalized output (321). The updated equalized output is processed consistent with the processing set forth in blocks 320-330. Alternatively, where a fast retry is to be implemented (block 304), one or more parameters and/or soft data from preceding data detection or data decoding processes may be modified (block 326). After modification, the processes of blocks 320-330 repeated for the previously stored equalized data.

In some cases, a buffer holding the equalized output is dynamically shared between equalized outputs that have failed (i.e., the timeout condition has been met) and equalized outputs that are still processing. In such a sharing mode, the averaging process may not be applied, but rather a new read is treated separately in a retry condition. In such cases, the re-read data assume a new position in the equalized data buffer. The new position is an open location where available, or replacing the oldest failed data set in the equalized data buffer. In some cases, where the retry process has continued for a defined maximum period without converging, the corresponding failed decode output is simply reported to the requesting host with an indication of the failure.

Following flow diagram 301, it is determined whether a data decoder circuit is available (block 340). In some cases, the data decoder circuit is a low density parity check decoder circuit as are known in the art. Where the data decoder circuit is available (block 340), a previously stored derivative of a detected output is accessed from the central memory (block 345). A data decode algorithm is applied to the derivative of the detected output to yield a decoded output (block 350).

It is determined whether the decoded output converged (i.e., the original data set is recovered) (block 355). In some cases, such convergence is found where all of the checksum equations utilized as part of a low complexity decode algorithm are correct (i.e., there are no unsatisfied checks). Where the decode algorithm converged (block 355), the decoded output is provided as a hard decision output (block 360). Otherwise, where the decode algorithm failed to converge (block 355), it is determined whether another local iteration (i.e., pass through the data decoder circuit) is desired (block 365). In some cases, the maximum number of local iterations is pre-defined. In some cases, the maximum number of local iterations is four. Based upon the disclosure provided herein, one of ordinary skill in the art will recognize other values of the maximum number of local iterations that may be used in relation to different embodiments of the present invention. Where another local iteration is desired (e.g., the number of local iterations is less than the maximum number) (block 365), the processes of blocks 350-365 are repeated for the same data set using the previous decoded output as a guide.

Otherwise, where another local iteration is not desired (e.g., the number of local iterations equals the maximum number) (block 365), it is determined whether a timeout condition has occurred (block 370). As used herein the phrase "timeout condition" is used in its broadest sense to mean any condition where processing of a current data set has completed without converging. Such a timeout condition may occur where, for example, the currently processing codeword has spent too much time in the data processing system, the number of global iterations (i.e., applications of both the data decode algorithm and the data detection algorithm) applied to the currently processing codeword has exceeded a maximum number, or there is insufficient free buffer space in the data processing circuit to support another global iteration. Based upon the disclosure provided herein, one of ordinary skill in the art will recognize a variety of scenarios that could be used to define the timeout condition. Where the timeout condition has not yet been met (block 370), the decoded output is stored to the central memory circuit where it awaits processing by the data detector circuit (i.e., another global iteration) (block 375). Alternatively, where the timeout condition is met (block 370), a retry condition is selected (block 380). This retry condition is the retry condition tested by block 303 of flow diagram 300.

Following flow diagram 302, it is determined whether a hard decision is received (block 331). As discussed in relation to flow diagram 301, a hard decision is received (block 360) where it is determined that a decoded output converged (block 355). Where a hard decision has been received (block 331), it is determined whether a retry condition is selected (block 336). As discussed in relation to flow diagram 301, a retry condition is selected when a timeout condition is met (block 370). Where a retry condition is not selected (block 336), the received hard decision data is assembled in an ordered fashion with previously hard decision outputs (block 346). It is then determined whether the entire requested data set is available in order (block 351). Where the entire requested data set is available (block 351), the ordered data set is provided to the requesting host (block 356). Alternatively, where a retry condition is selected (block 336), the received hard decision output is provided to the requesting host immediately (block 341), and the processes of blocks 346, 351, 356 are repeated for the newly received hard decision data.

Figure 4:
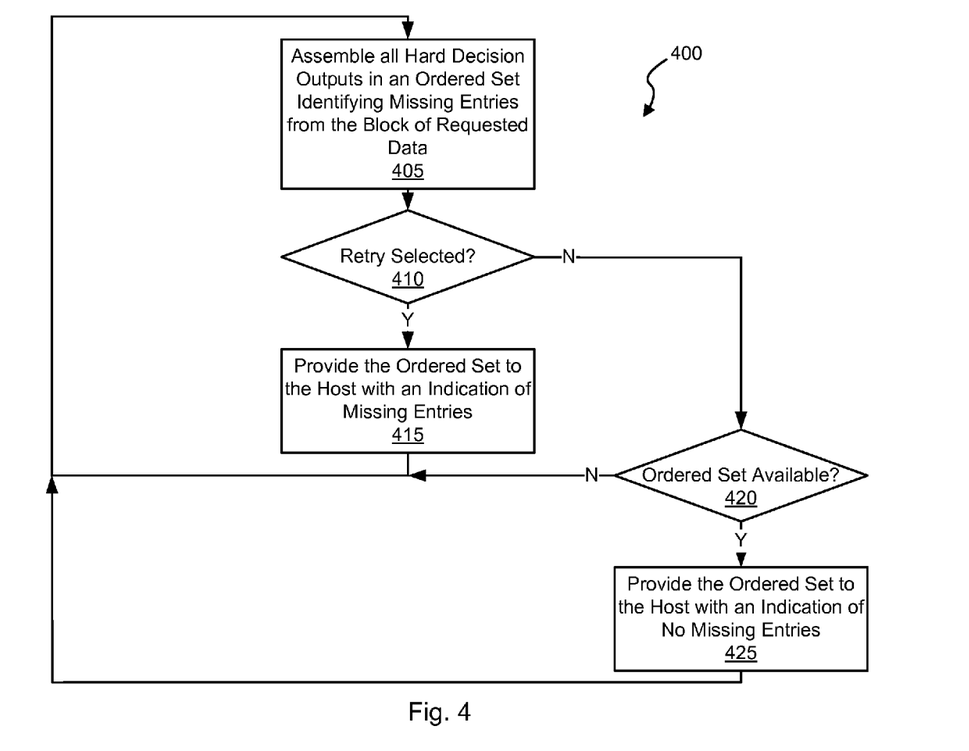
FIG. 4 is a flow diagram showing a process for selectable out of order data reporting that may be used in accordance other embodiments of the present invention.
Figure 6A:
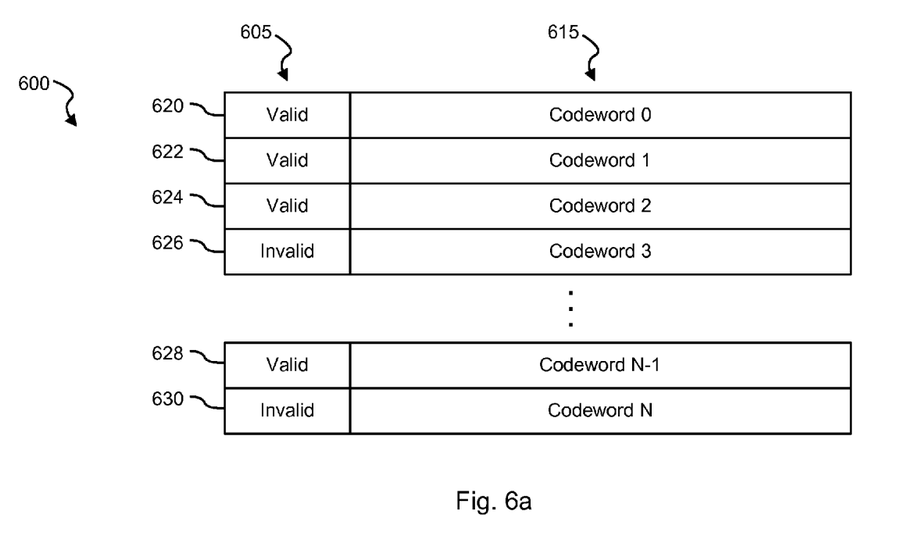
FIGS. 6a-6b are examples of codeword storage in a host or data processing circuit that may occur through use of one or more embodiments of the present invention.

Turning to FIG. 4, a flow diagram 400 shows an alternative approach for providing received hard decision data sets selectably out of order in accordance other embodiments of the present invention. The hard decision data sets may be provided using the methods discussed above in relation to flow diagrams 300 and 301 of FIGS. 3a-3b where block 360 provides the hard decision data sets. Following flow diagram 400, all available hard decision data sets are assembled in an ordered data set with the missing hard decision data sets corresponding to a requested block of data (bock 405). FIG. 6a shows an example of a codeword storage 600 including a number of codeword storage locations 620, 622, 624, 626, 628, 630 each with an area 615 for a codeword and an area 605 for a validity status indicator. In the depicted example, the codeword in codeword storage area 626 and the codeword in codeword storage area 630 have not converged.

Figure 6B:
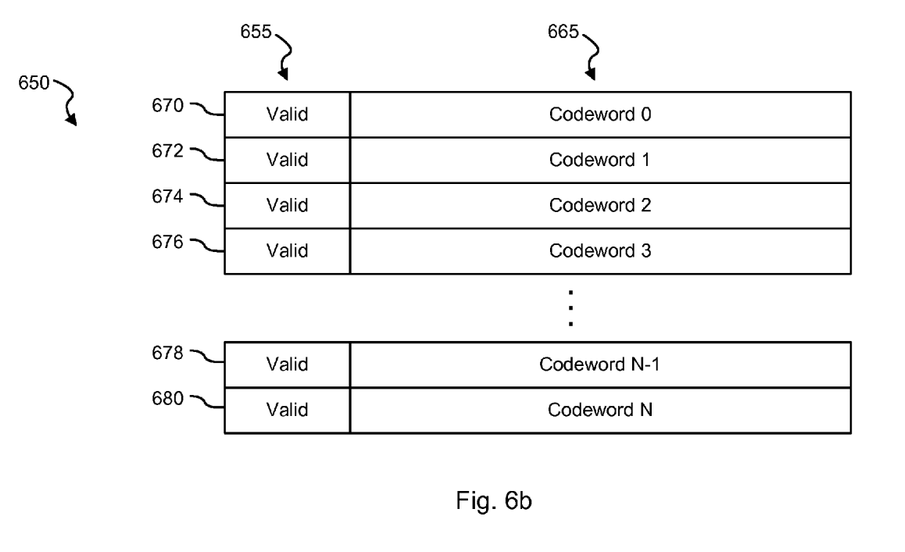

Returning to FIG. 4, it is determined whether a retry condition is selected (block 410). Similar to that discussed in relation to flow diagram 301 of FIG. 3b, a retry condition is selected when a timeout condition is met. Where a retry condition is selected (block 410), the ordered data set in its incomplete condition (i.e., including indications of missing entries) is provided to the requesting host (block 415). Otherwise, where a retry condition is not selected met (block 410), it is determined whether complete ordered data set is available (block 420). Such a complete set is a series of ordered hard decision data sets that do not include intervening missing data sets. FIG. 6b shows an example of a codeword storage 650 including a number of codeword storage locations 670, 672, 674, 676, 678, 670 each with an area 665 for a codeword and an area 655 for a validity status indicator. In the depicted example, all of the codewords are identified as valid (i.e., all of the codewords converged). Returning to FIG. 4, where a complete ordered data set is available (block 420), the ordered data set is provided to the host with an indication of no missing entries (block 425).

Figure 5:
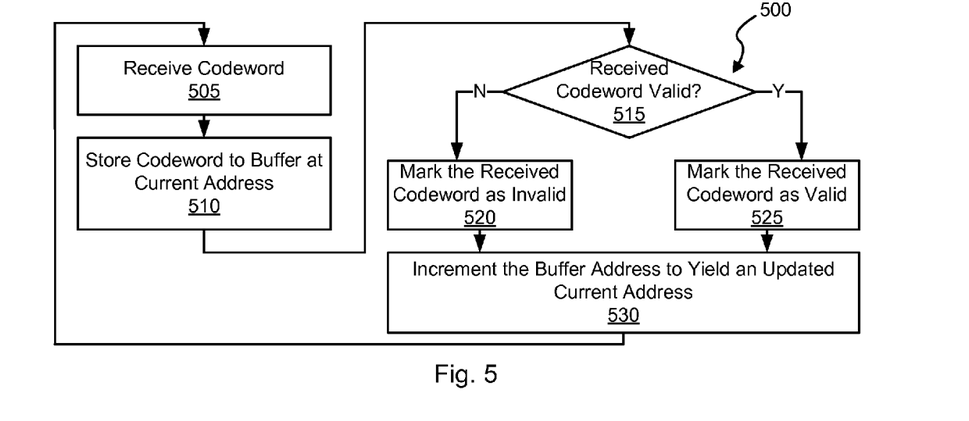
FIG. 5 is a flow diagram showing a process for host reception of processed data that may be used in relation to one or more embodiments of the present invention.

Turning to FIG. 5, a flow diagram 500 shows a process for host reception of processed data that may be used in relation to one or more embodiments of the present invention. Following flow diagram 500, a codeword (i.e., hard decision data set) is received by the host from the data processing circuit (block 505). The received codeword is stored at a location in a codeword buffer at a current address (block 510). It is determined whether the received codeword is valid (block 515). Where the codewords are being reported out of order, one or more codewords in the requested block may be identified as invalid. An example of such is shown in FIG. 5a. Where the received codeword is invalid (block 515), the codeword storage location corresponding to the current address is identified as invalid (block 520). Alternatively, where the received codeword is valid (block 515), the codeword storage location corresponding to the current address is identified as valid (block 525). The address used to access the storage buffer is incremented to yield an updated current address (block 530), and the processes of blocks 505-530 are repeated for the next received codeword.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for performing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for data processing in a storage device, the method comprising:
   receiving a request for an ordered data set by a data processing circuit, wherein the ordered data set includes:
   a first output corresponding to a first input, and
   a second output corresponding to a second input, wherein the first output precedes the second output in the ordered data set;
   determining a retry status of the data processing circuit; and
   selectively reporting the first output and the second output based at least in part on the retry status.

2. The method of claim 1, wherein selectively reporting the first output and the second output comprises:
   providing the first output and the second output out of order based at least in part on the retry status indicating a retry is selected; and
   providing the first output and the second output in order based at least in part on the retry status indicating a retry is not selected.

3. The method of claim 1, the method further comprising:
   accessing a storage medium to obtain the first input and the second input.

4. The method of claim 1, the method further comprising:
   applying a data decode algorithm to a first decoder input derived from the first input to yield the first output; and
   applying the data decode algorithm to the second decoder input derived from the second input to yield the second output.

5. The method of claim 4, wherein determining a retry status of the data processing circuit is based at least in part on a result of applying the data decode algorithm.

6. The method of claim 4, wherein the data decode algorithm is a low density parity check algorithm.

7. A data processing system, the system comprising:
   a data decoder circuit operable to generate a first output based on a first input and a second output based on a second input, wherein the first input is available to the data decoder circuit before the second input, and wherein the second output is available from the data decoder circuit before the first output; and
   a data output circuit operable to report the first output and the second output in a reporting order selected based at least in part on a retry condition being met.

8. The data processing system of claim 7, wherein the data decoder circuit is operable to apply a data decode algorithm to the first input to yield the first output, and to apply the data decode algorithm to the second input to yield the second output.

9. The data processing system of claim 8, wherein the data decode algorithm is a low density parity check algorithm.

10. The data processing system of claim 7, wherein the data output circuit is operable to report the second output prior to the first output when the retry condition is met and the first output is not yet available from the data decoder circuit.

11. The data processing system of claim 7, wherein the data output circuit is operable to report the first output prior to the second output when the retry condition is met and the first output is available.

12. The data processing system of claim 7, wherein the data output circuit is operable to report the first output prior to the second output when the retry condition is not met.

13. The data processing system of claim 7, wherein the retry condition is met when a timeout condition occurs.

14. The data processing system of claim 7, wherein when the retry condition is met, a retry processing algorithm is applied to a failed codeword.

15. The data processing system of claim 7, wherein the data processing system is implemented as part of a data storage device.

16. The data processing system of claim 7, wherein the data processing system is implemented as an integrated circuit.

17. A data processing system, the system comprising:
   a data requesting circuit operable to request an ordered data set, wherein the ordered data set includes: a first output corresponding to a first detector input, and a second output corresponding to a second detector input, and wherein the first output precedes the second output in the ordered data set; and
   a data receiving circuit operable to selectively receive the requested ordered data set as one of an in order data set or an out of order data set, wherein in an in order data set includes the first output preceding the second output, and wherein the out of order data set includes the second output preceding the first output.

18. The data processing system of claim 17, wherein the system further comprises:
   a data detector circuit operable to:
   apply a data detection algorithm to the first detector input to yield a first detected output;
   apply the data detection algorithm to the second detector input to yield a second detected output;
   a data decoder circuit operable to:
   apply a data decode algorithm to the first decoder input derived from the first detected output to yield a first decode output;
   apply the data decode algorithm to the second decoder input derived from the second detected output to yield a second decode output, wherein the second decode output is available before the first decode output; and
   a data output circuit operable to selectively report the first output derived from the first decode output and the second output derived from the second decode output is a reporting order based at least in part on a retry condition being met.

19. The data processing system of claim 18, wherein the data output circuit is operable to report the second output prior to the first output when the retry condition is met and the first decode output is not yet available; wherein the data output circuit is operable to report the first output prior to the second output when the retry condition is met and the first decode output is available; and wherein the data output circuit is operable to report the first output prior to the second output when the retry condition is not met.

20. The data processing system of claim 17, wherein the data processing system is implemented as part of a data storage device.

* * * * *